United States Patent
Wang et al.

(10) Patent No.: US 11,476,441 B2
(45) Date of Patent: Oct. 18, 2022

(54) DISPLAY APPARATUS AND METHOD OF FABRICATING DISPLAY APPARATUS

(71) Applicant: BOE Technology Group Co., Ltd., Beijing (CN)

(72) Inventors: Haoran Wang, Beijing (CN); Paoming Tsai, Beijing (CN); Ziyu Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 240 days.

(21) Appl. No.: 16/769,385

(22) PCT Filed: Aug. 12, 2019

(86) PCT No.: PCT/CN2019/100195
§ 371 (c)(1),
(2) Date: Jun. 3, 2020

(87) PCT Pub. No.: WO2021/026721
PCT Pub. Date: Feb. 18, 2021

(65) Prior Publication Data
US 2022/0006045 A1    Jan. 6, 2022

(51) Int. Cl.
*H01L 51/52* (2006.01)
*G02F 1/1333* (2006.01)
*G02F 1/1335* (2006.01)

(52) U.S. Cl.
CPC .... *H01L 51/5246* (2013.01); *G02F 1/133331* (2021.01); *G02F 1/133512* (2013.01); *G02F 1/133504* (2013.01); *G02F 2202/28* (2013.01); *H01L 51/5281* (2013.01)

(58) Field of Classification Search
None
See application file for complete search history.

(56) References Cited

U.S. PATENT DOCUMENTS

2019/0331960 A1    10/2019    Li et al.

FOREIGN PATENT DOCUMENTS

| CN | 107451576 A | 12/2017 |
|----|-------------|---------|
| CN | 108594524 A | 9/2018  |
| CN | 109164648 A | 1/2019  |
| CN | 109782461 A | 5/2019  |

(Continued)

OTHER PUBLICATIONS

International Search Report & Written Opinion dated Apr. 26, 2020, regarding PCT/CN2019/100195.

*Primary Examiner* — Richard H Kim
(74) *Attorney, Agent, or Firm* — Intellectual Valley Law, P.C.

(57) ABSTRACT

A display apparatus having a display region, and a window region substantially surrounded by the display region and configured to install an accessory therein is provided. The display apparatus in the display region includes a plurality of display functional layers, the plurality of display functional layers comprising a display substrate. The display apparatus in the window region includes an optical clear adhesive layer at least partially occupying an accessory hole in the window region; and the accessory on a side of the optical clear adhesive layer away from a cover glass. The display substrate is completely absent in the accessory hole. The display apparatus is absent of any air layer between the optical clear adhesive layer and the cover glass.

18 Claims, 8 Drawing Sheets

(56) References Cited

FOREIGN PATENT DOCUMENTS

| | | |
|---|---|---|
| CN | 109860266 A | 6/2019 |
| CN | 209028373 U | 6/2019 |
| JP | 2014103458 A | 6/2014 |
| WO | 2019205627 A1 | 10/2019 |

DISPLAY APPARATUS AND METHOD OF FABRICATING DISPLAY APPARATUS

CROSS-REFERENCE TO RELATED APPLICATION

This application is a national stage application under 35 U.S.C. § 371 of International Application No. PCT/CN2019/100195, filed Aug. 12, 2019, the contents of which are incorporated by reference in the entirety.

TECHNICAL FIELD

The present invention relates to display technology, more particularly, to a display apparatus and a method of fabricating a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD. An OLED display apparatus typically includes an anode, an organic layer including a light emitting layer, and a cathode. OLEDs can be either a bottom-emission type OLED or a top-emission type OLED.

SUMMARY

In one aspect, the present invention provides a display apparatus having a display region, and a window region substantially surrounded by the display region and configured to install an accessory therein; wherein the display apparatus in the display region comprises a plurality of display functional layers, the plurality of display functional layers comprising a display substrate; wherein the display apparatus in the window region comprises an optical clear adhesive layer at least partially occupying an accessory hole in the window region; and the accessory on a side of the optical clear adhesive layer away from a cover glass; wherein the display substrate is completely absent in the accessory hole; and the display apparatus is absent of any air layer between the optical clear adhesive layer and the cover glass.

Optionally, the plurality of display functional layers in the display region comprises a back side functional layer; the display substrate on the back side functional layer; a front side functional layer on a side of the display substrate away from the back side functional layer; and the cover glass on a side of the front side functional layer away from the display substrate; wherein the display substrate and the back side functional layer are completely absent in an accessory hole in the window region.

Optionally, the optical clear adhesive layer is in direct contact with the cover glass; the accessory is in direct contact with the optical clear adhesive layer; and the display apparatus is absent of any air layer between the cover glass and the accessory.

Optionally, the display apparatus further comprises a unidirectional light transmitting layer in the accessory hole that allows light transmit through the cover glass and the optical clear adhesive layer but substantially block light from transmitting along a direction from the optical clear adhesive layer to the cover glass.

Optionally, the unidirectional light transmitting layer is in direct contact with the cover glass; the optical clear adhesive layer is in direct contact with the unidirectional light transmitting layer; and the accessory is in direct contact with the optical clear adhesive layer.

Optionally, the optical clear adhesive layer completely occupies a portion of the accessory hole corresponding to the display substrate; and a portion of a lateral wall defining the accessory hole corresponding to the display substrate is completely covered by the optical clear adhesive layer.

Optionally, the display apparatus further comprises a light shielding coating coated on at least a portion of a lateral wall defining the accessory hole.

Optionally, the optical clear adhesive layer comprises an optical clear adhesive material having a refractive index greater than a refractive index of the cover glass, thereby reducing light reflection on a surface of the display apparatus.

Optionally, the optical clear adhesive layer further comprises a light diffuser.

Optionally, the light diffuser is selected from a group consisting of titanium dioxide, talcum, calcium carbonate, barium sulfate, aluminum hydroxide, silica, glass, mica, white carbon, magnesium oxide, zinc oxide, acrylic-based particles, siloxane-based particles, melamine-based particles, polycarbonate-based particles, and styrene-based particles.

Optionally, the front side functional layer is a continuous layer extending through the display region and the window region, and is present in the accessory hole; and the optical clear adhesive layer comprises a first sub-layer in the window region and between the cover glass and a portion of the front side functional layer in the accessory hole, and a second sub-layer in the window region and on a side of the portion of the front side functional layer in the accessory hole away from the cover glass.

Optionally, the first sub-layer and the second sub-layer comprise a same material; one side of the first sub-layer is in direct contact with the cover glass and an opposite side of the first sub-layer is in direct contact with the portion of the front side functional layer in the accessory hole; and the second sub-layer is in direct contact with the portion of the front side functional layer in the accessory hole.

Optionally, the front side functional layer comprises a touch electrode layer.

Optionally, the accessory hole is partially occupied and partially unoccupied by the optical clear adhesive layer.

Optionally, the accessory is at least partially in the accessory hole.

Optionally, the accessory hole is completely occupied by the optical clear adhesive layer.

Optionally, the optical clear adhesive layer partially extends outside the accessory hole; and the accessory is outside the accessory hole.

Optionally, the display apparatus further comprises a unidirectional light transmitting layer in the accessory hole that allows light transmit through the cover glass and the optical clear adhesive layer but substantially block light from transmitting along a direction from the optical clear adhesive layer to the cover glass; and a light shielding coating coated on at least a portion of a lateral wall defining the accessory hole; wherein the unidirectional light transmitting layer is in direct contact with the cover glass; the optical clear adhesive layer is in direct contact with the unidirectional light transmitting layer; the accessory is in direct contact with the optical clear adhesive layer; the display apparatus is absent of any air layer between the cover glass and the accessory; wherein the front side functional layer is a continuous layer extending through the display region and the window region, and is present in the accessory hole; the optical clear adhesive layer comprises a first sub-layer in the window region and between the cover glass and a portion of the front side functional layer in the accessory hole, and a second sub-layer in the window region and on a side of the portion of the front side functional layer in the accessory hole away from the cover glass; the first sub-layer and the second sub-layer comprise a same material; one side of the first sub-layer is in direct contact with the cover glass and an opposite side of the first sub-layer is in direct contact with the portion of the front side functional layer in the accessory hole; and the second sub-layer is in direct contact with the portion of the front side functional layer in the accessory hole.

Optionally, the accessory is a lens of a camera.

In another aspect, the present invention provides a method of fabricating a display apparatus having a display region, and a window region substantially surrounded by the display region and configured to install an accessory therein, comprising, in the display region, forming a plurality of display functional layers, the plurality of display functional layers comprising a display substrate; in the window region, forming an accessory hole in the window region; forming an optical clear adhesive layer at least partially occupying the accessory hole; and forming an accessory on a side of the optical clear adhesive layer away from a cover glass; wherein the display substrate is completely absent in the accessory hole; and the display apparatus is absent of an air layer between the optical clear adhesive layer and the cover glass.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
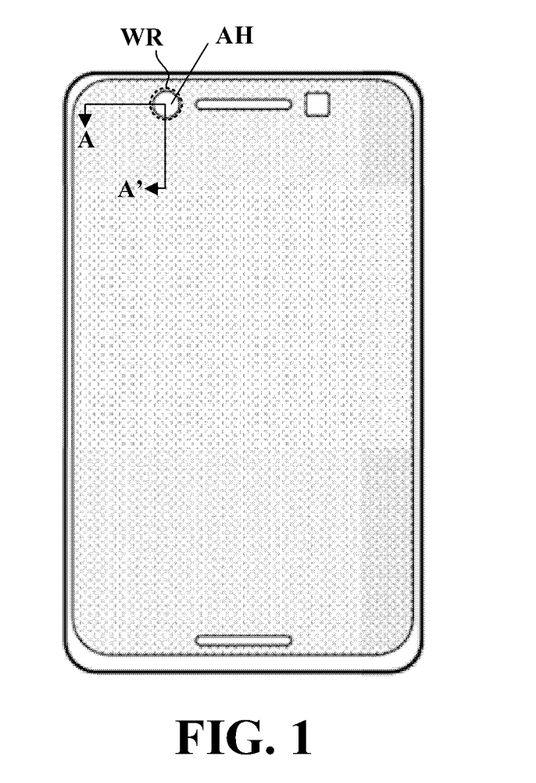
FIG. 1 is a schematic diagram of a display apparatus in some embodiments according to the present disclosure.

FIG. 1 is a schematic diagram of a display apparatus in some embodiments according to the present disclosure. Referring to FIG. 1, the display apparatus in some embodiments has a window region WR typically formed by punching an accessory hole AH in the display apparatus. The window region WR typically is used for installing an accessory. Examples of accessories that may be installed in the window region include an earpiece, a camera, a photosensor, a distance sensor, an infrared sensor, a fingerprint sensor, an acoustic sensor, an indicator, a button, a knob, or any combination thereof. It is discovered in the present disclosure that the display apparatus is particularly prone to moist and oxygen permeation in the window region. For example, the encapsulating layer may not be able to encapsulate the display substrate when the window region is formed. Particularly, a fabrication process of an organic light emitting diode display substrate often adopts an open mask process to deposit one or more organic material layer and electrode layer, e.g., without any patterning steps. The encapsulating layer in the window region cannot satisfactorily encapsulate these organic material layer and electrode layer, leading to exposure of the display substrate to external oxygen and moist.

Moreover, when the accessory installed in the window region is an optical component such as a lens for a camera, the presence of an air gap in the window region between the cover glass and the accessory adversely affect the optical performance of the accessory. For example, the presence of the air gap leads to abnormal light reflection in the window region, not only affecting image capturing function of the accessory, but also leads to display non-uniformity in the display apparatus.

Accordingly, the present disclosure provides, inter alia, a display apparatus and a method of fabricating a display apparatus that substantially obviate one or more of the problems due to limitations and disadvantages of the related art. In one aspect, the present disclosure provides a display apparatus. In some embodiments, the display apparatus has a display region, and a window region substantially surrounded by the display region and configured to install an accessory therein. Optionally, the display apparatus in the display region includes a plurality of display functional layers, the plurality of display functional layers comprising a display substrate. Optionally, the display apparatus in the window region includes an optical clear adhesive layer at least partially occupying the accessory hole; and the accessory on a side of the optical clear adhesive layer away from the cover glass. Optionally, the display substrate is completely absent in an accessory hole in the window region.

Optionally, the display apparatus is absent of any air layer between the optical clear adhesive layer and the cover glass. Optionally, the display apparatus is an organic light emitting diode display apparatus.

In some embodiments, the display apparatus includes a back side functional layer; a display substrate on the back side functional layer; a front side functional layer on a side of the display substrate away from the back side functional layer; and a cover glass on a side of the front side functional layer away from the display substrate. Optionally, the display apparatus has a display region, and a window region substantially surrounded by the display region and configured to install an accessory therein. Optionally, the display substrate and the back side functional layer are completely absent in an accessory hole in the window region. Optionally, the display apparatus in the window region includes an optical clear adhesive layer at least partially occupying the accessory hole; and the accessory on a side of the optical clear adhesive layer away from the cover glass. Optionally, the display apparatus is absent of any air layer between the optical clear adhesive layer and the cover glass.

As used herein, the term "display region" refers to a region of a display apparatus where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to a region of a display apparatus where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display region.

As used herein the term "window region" refers to a region of a display apparatus where an accessory hole is formed for installing an accessory. Optionally, the window region is in the peripheral area, and optionally substantially surrounded by the display region.

As used herein the term "substantially surrounding" refers to surrounding at least 50% (e.g., at least 60%, at least 70%, at least 80%, at least 90%, at least 95%, at least 99%, and 100%) of a perimeter of an area.

Figure 2:
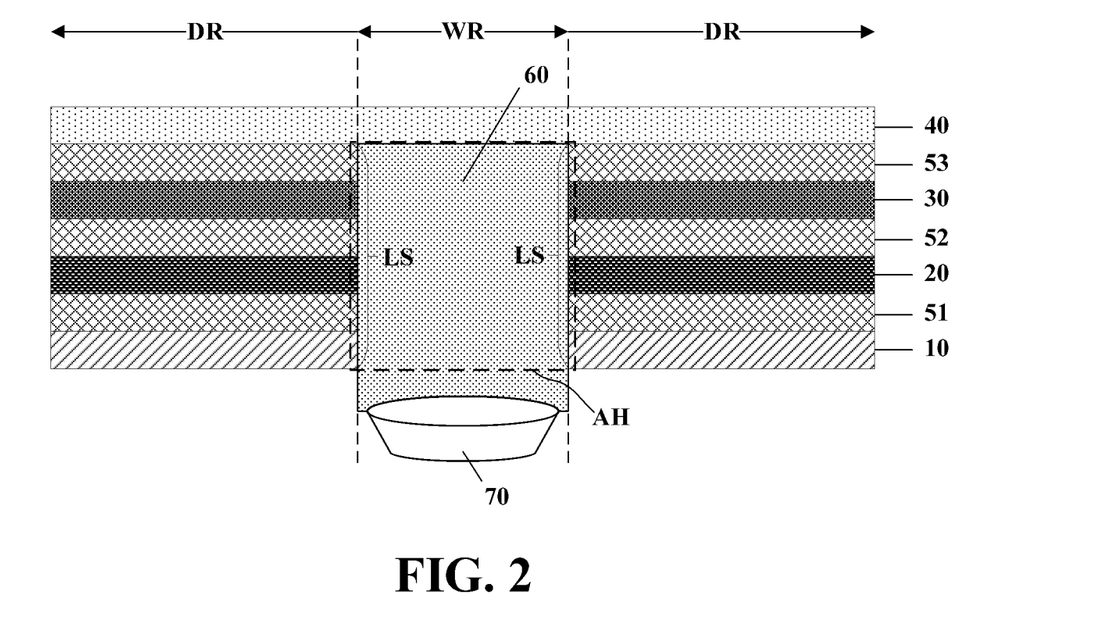
FIG. 2 is a cross-sectional view of a window region of a display apparatus in some embodiments according to the present disclosure.

FIG. 2 is a cross-sectional view of a window region of a display apparatus in some embodiments according to the present disclosure. For example, FIG. 2 may be a cross-sectional view along an A-A' line in FIG. 1. Referring to FIG. 2, the display apparatus in some embodiments has a display region DR, and a window region WR substantially surrounded by the display region DR and configured to install an accessory 70 therein. In some embodiments, the display apparatus includes a back side functional layer 10; a display substrate 20 on the back side functional layer 10; a front side functional layer 30 on a side of the display substrate 20 away from the back side functional layer 10; and a cover glass 40 on a side of the front side functional layer 30 away from the display substrate 20. Optionally, the display apparatus further includes a plurality of adhesive layers for adhering various layers with the display substrate 20. In one example, the display apparatus includes a first adhesive layer 51 for adhering the display substrate 20 with the back side functional layer 10, a second adhesive layer 52 for adhering the display substrate 20 with the front side functional layer 30, and a third adhesive layer 53 for adhering the front side functional layer 30 with the cover glass 40. Optionally, the display substrate 20 further includes a plurality of thin film transistors and a plurality of light emitting elements. Various appropriate light emitting elements may be used in the present display substrate. Examples of appropriate light emitting elements include organic light emitting diodes, quantum dots light emitting diodes, and micro light emitting diodes.

The front side functional layer may include, for example, a touch electrode layer, a polarizer, a light modulating layer, an anti-reflective layer, and so on. The back side functional layer may include, for example, a circuit layer, a flexible base substrate, a backlight module (when the display apparatus is a liquid crystal display apparatus), a polarizer, a light modulating layer, and so on.

In some embodiments, the display apparatus has an accessory hole AH in the window region WR. Optionally, the display substrate 20 is completely absent in the accessory hole AH in the window region WR. Optionally, as shown in FIG. 2, the display substrate 20 and the back side functional layer 10 are completely absent in the accessory hole AH in the window region WR. Optionally, the first adhesive layer 51, the second adhesive layer 52, and the third adhesive layer 53 are completely absent in the accessory hole AH in the window region WR.

In some embodiments, the display apparatus in the window region WR includes an optical clear adhesive layer 60 at least partially occupying the accessory hole AH; and an accessory 70 on a side of the optical clear adhesive layer 60 away from the cover glass 40. By having an optical clear adhesive layer 60 at least partially occupying the accessory hole AH, the display apparatus is absent of any air layer between the optical clear adhesive layer 60 and the cover glass 40. Optionally, the display apparatus is absent of any air layer between the cover glass 40 and the accessory 70. By eliminating or reducing the presence of the air gap, the optical performance of the accessory 70 can be significantly enhanced by obviating the abnormal light reflection in the window region due to the air gap. Also, display uniformity of the display apparatus can be improved as well.

Figure 3:
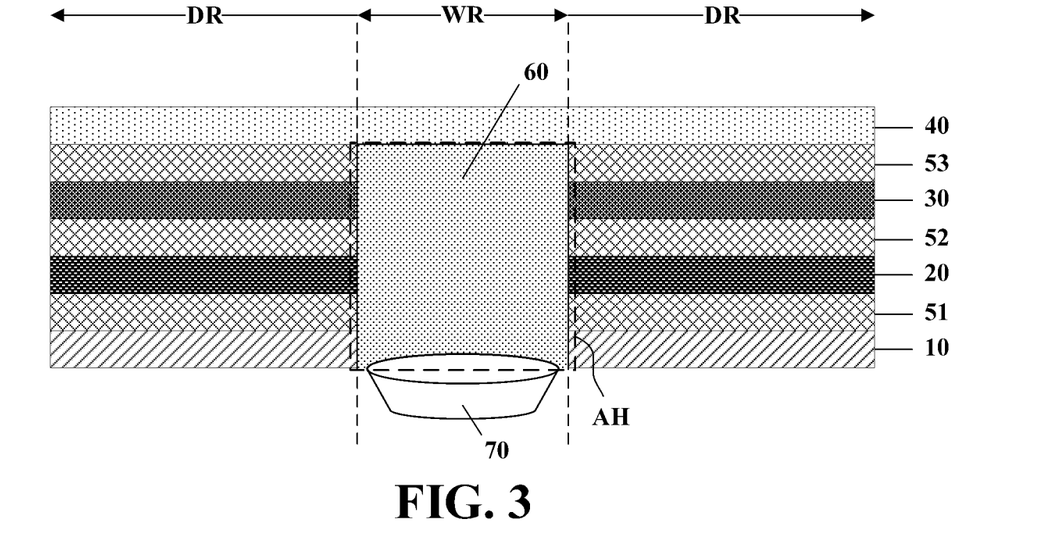
FIG. 3 is a cross-sectional view of a window region of a display apparatus in some embodiments according to the present disclosure.
Figure 4:
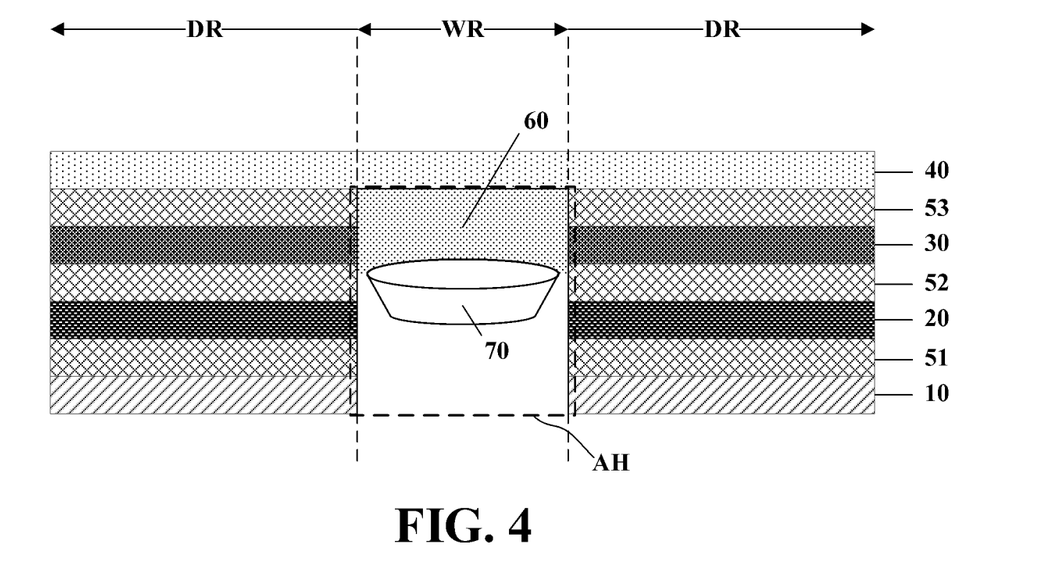
FIG. 4 is a cross-sectional view of a window region of a display apparatus in some embodiments according to the present disclosure.

In some embodiments, the optical clear adhesive layer 60 is in direct contact with the cover glass 40. Optionally, the accessory 70 is in direct contact with the optical clear adhesive layer 60. Optionally, and as shown in FIG. 2, the optical clear adhesive layer 60 partially extends outside the accessory hole AH, and the accessory 70 is outside the accessory hole AH. FIG. 3 is a cross-sectional view of a window region of a display apparatus in some embodiments according to the present disclosure. Referring to FIG. 3, the accessory hole AH is completely occupied by the optical clear adhesive layer 60, the optical clear adhesive layer 60 does not extend outside the accessory hole AH, and the accessory 70 is outside the accessory hole AH. Optionally, an interface between the accessory 70 and the optical clear adhesive layer 60 is substantially co-planar with a surface of the back side functional layer 10 in the display region DR. FIG. 4 is a cross-sectional view of a window region of a display apparatus in some embodiments according to the present disclosure. Referring to FIG. 4, the accessory hole AH is partially occupied and partially unoccupied by the optical clear adhesive layer 60. Optionally, the accessory 70 is at least partially in the accessory hole AH.

Figure 5:
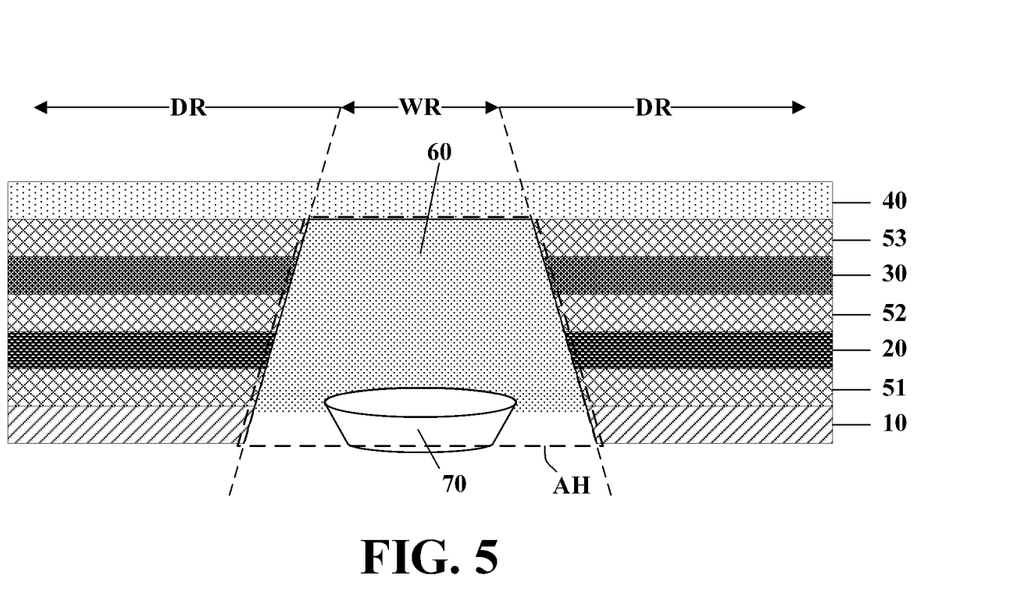
FIG. 5 is a cross-sectional view of a window region of a display apparatus in some embodiments according to the present disclosure.
Figure 6:
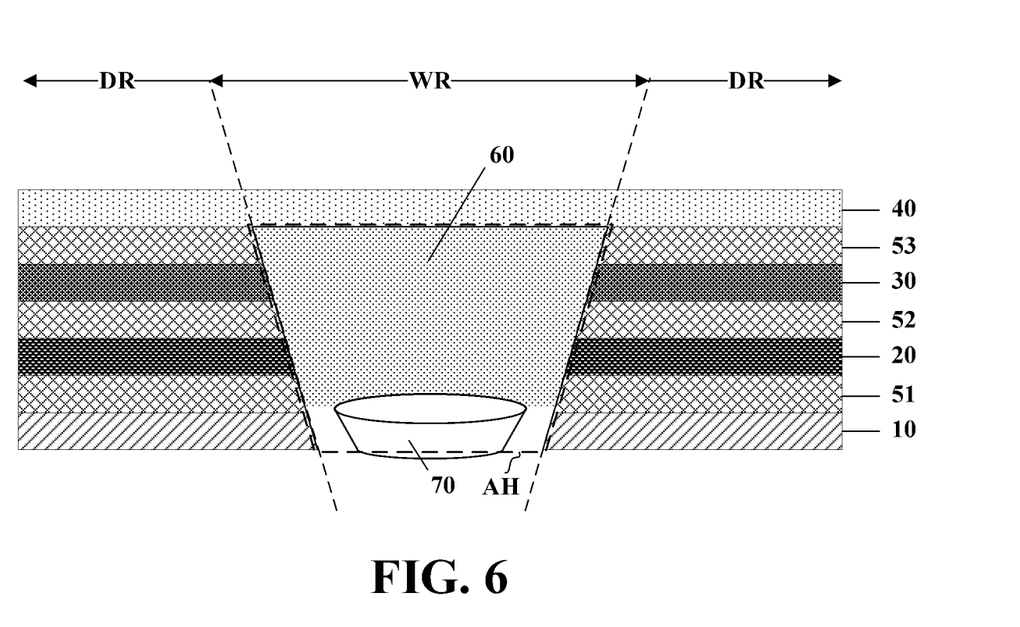
FIG. 6 is a cross-sectional view of a window region of a display apparatus in some embodiments according to the present disclosure.

As shown in FIGS. 2 to 4, a cross-section of the accessory hole AH along a plane intersecting with, and substantially perpendicular to, each of the back side functional layer 10, the display substrate 20, the front side functional layer 30, and the cover glass 40 has a substantially rectangular or square shape. FIG. 5 is a cross-sectional view of a window region of a display apparatus in some embodiments according to the present disclosure. Referring to FIG. 5, a cross-section of the accessory hole AH along a plane intersecting with, and substantially perpendicular to, each of the back side functional layer 10, the display substrate 20, the front side functional layer 30, and the cover glass 40 has a substantially trapezoidal shape. FIG. 6 is a cross-sectional view of a window region of a display apparatus in some embodiments according to the present disclosure. Referring to FIG. 6, a cross-section of the accessory hole AH along a plane intersecting with, and substantially perpendicular to, each of the back side functional layer 10, the display substrate 20, the front side functional layer 30, and the cover glass 40 has a substantially inverted trapezoidal shape. The cross-section may have any appropriate shapes, regular or irregular. Examples of appropriate shapes of the cross-section include a rectangular shape, a square shape, a trapezoidal shape, an inverted trapezoidal shape, a triangular shape, an elliptical shape or partial elliptical shape, a polygonal shape, and so on.

Referring to FIGS. 2, 3, 5, and 6, in some embodiments, the optical clear adhesive layer 60 completely occupies a portion of the accessory hole AH corresponding to the display substrate 20. As shown in FIG. 2, a portion of a lateral wall LS defining the accessory hole AH corresponding to the display substrate 20 is completely covered by the optical clear adhesive layer 60. By having the optical clear adhesive layer 60 completely covering the portion of the lateral wall LS defining the accessory hole AH corresponding to the display substrate 20, the display substrate 20 can be much better encapsulated, preventing external moist and oxygen from entering the display substrate 20 from the accessory hole AH in the window region WR.

Referring to FIGS. 2, 3, 5, and 6, in some embodiments, the optical clear adhesive layer 60 completely occupies a portion of the accessory hole AH corresponding the display substrate 20 and the front side functional layer 30. As shown in FIG. 2, a portion of a lateral wall LS defining the accessory hole AH corresponding to the display substrate 20 and the front side functional layer 30 is completely covered by the optical clear adhesive layer 60. Referring to FIGS. 2 and 3, in some embodiments, the optical clear adhesive layer 60 completely occupies a portion of the accessory hole AH corresponding the display substrate 20, the front side functional layer 30, and the back side functional layer 10. As shown in FIG. 2, a portion of a lateral wall LS defining the accessory hole AH corresponding to the display substrate 20, the front side functional layer 30, and the back side functional layer 10 is completely covered by the optical clear adhesive layer 60.

Figure 7:
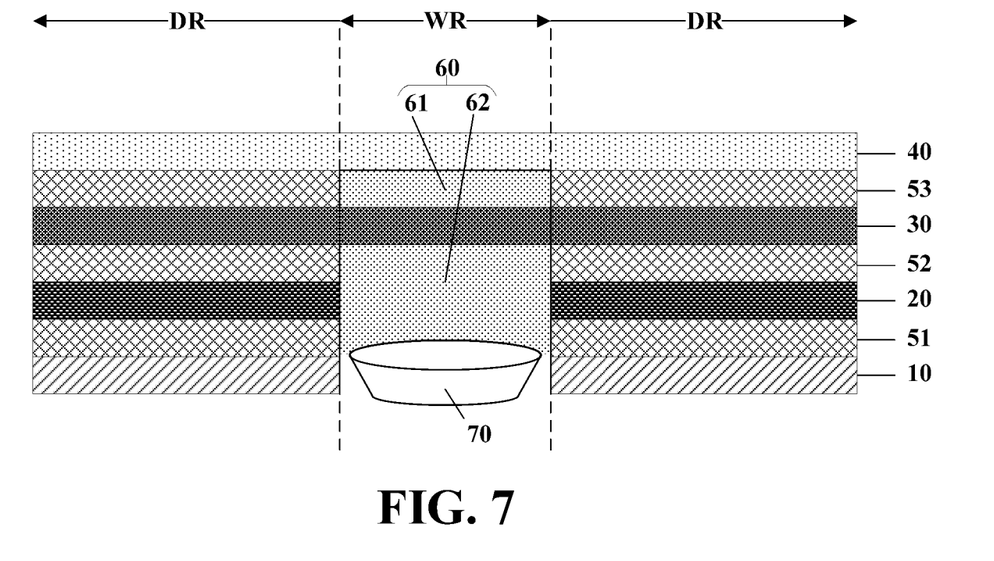
FIG. 7 is a cross-sectional view of a window region of a display apparatus in some embodiments according to the present disclosure.

FIG. 7 is a cross-sectional view of a window region of a display apparatus in some embodiments according to the present disclosure. Referring to FIG. 7, in some embodiments, the front side functional layer 30 is a continuous layer extending through the display region DR and the window region WR, and is present in the accessory hole AH. Optionally, the optical clear adhesive layer 60 includes a first sub-layer 61 in the window region WR and between the cover glass 40 and a portion of the front side functional layer 30 in the accessory hole AH, and a second sub-layer 62 in the window region WR and on a side of the portion of the front side functional layer 30 in the accessory hole AH away from the cover glass 40. Optionally, the first sub-layer 61 and the second sub-layer 62 include a same material. Optionally, one side of the first sub-layer 61 is in direct contact with the cover glass 40 and an opposite side of the first sub-layer 61 is in direct contact with the portion of the front side functional layer 30 in the accessory hole AH. Optionally, the second sub-layer 62 is in direct contact with the portion of the front side functional layer 30 in the accessory hole AH. Optionally, the front side functional layer 30 includes a touch electrode layer.

Figure 8:
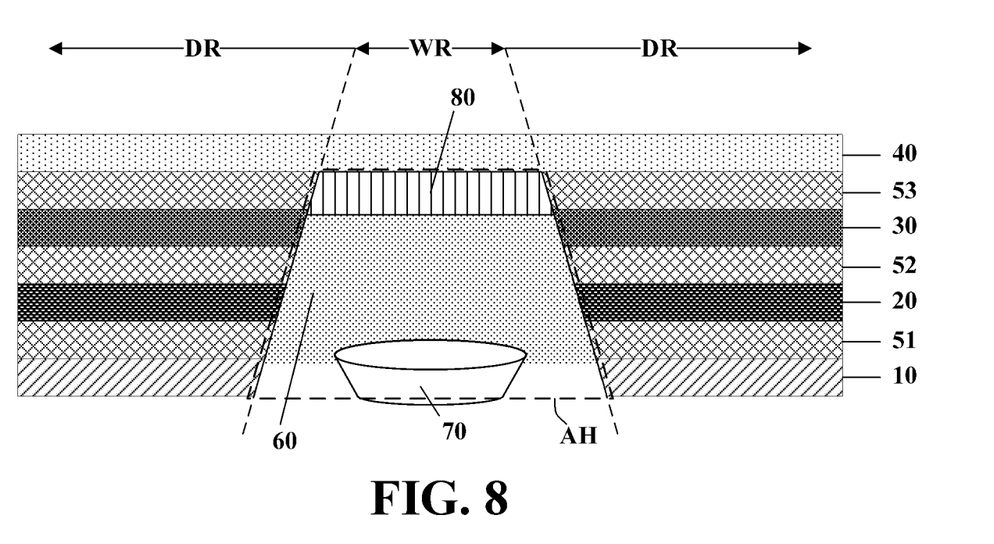
FIG. 8 is a cross-sectional view of a window region of a display apparatus in some embodiments according to the present disclosure.

FIG. 8 is a cross-sectional view of a window region of a display apparatus in some embodiments according to the present disclosure. Referring to FIG. 8, the display apparatus in some embodiments further includes a unidirectional light transmitting layer 80 in the accessory hole AH that allows light transmit through the cover glass 40 and the optical clear adhesive layer 60 but substantially block light from transmitting along a direction from the optical clear adhesive layer 60 to the cover glass 40. Optionally, the unidirectional light transmitting layer 80 is in direct contact with the cover glass 40, the optical clear adhesive layer 60 is in direct contact with the unidirectional light transmitting layer 80, and the accessory 70 is in direct contact with the optical clear adhesive layer 60.

Figure 9:
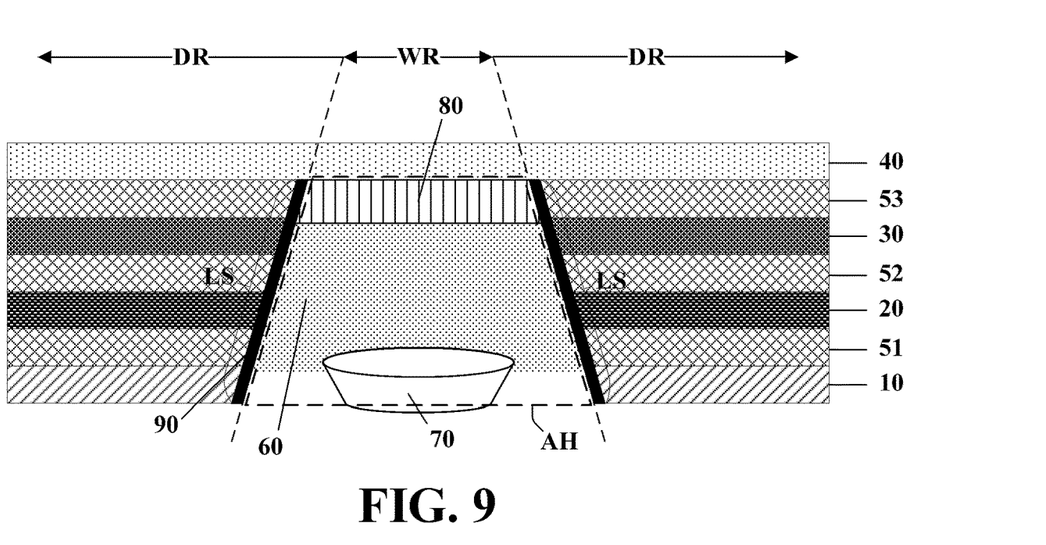
FIG. 9 is a cross-sectional view of a window region of a display apparatus in some embodiments according to the present disclosure.

FIG. 9 is a cross-sectional view of a window region of a display apparatus in some embodiments according to the present disclosure. Referring to FIG. 9, the display apparatus in some embodiments further includes a unidirectional light transmitting layer 80 in the accessory hole AH that allows light transmit through the cover glass 40 and the optical clear adhesive layer 60 but substantially block light from transmitting along a direction from the optical clear adhesive layer 60 to the cover glass 40; and a light shielding coating 90 coated on at least a portion of a lateral wall LS defining the accessory hole AH. Optionally, the light shielding coating 90 is coated on substantially an entirety of the lateral wall LS defining the accessory hole AH. The presence of the light shielding coating 90 on the lateral wall LS prevents light leakage into the accessory hole AH, shielding noise light from be received by the accessory 70.

Figure 10:
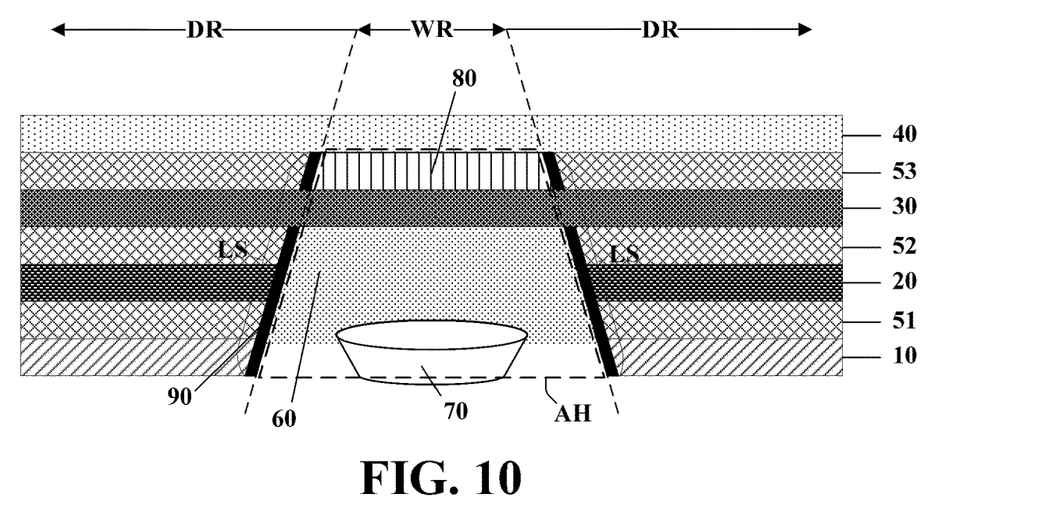
FIG. 10 is a cross-sectional view of a window region of a display apparatus in some embodiments according to the present disclosure.

FIG. 10 is a cross-sectional view of a window region of a display apparatus in some embodiments according to the present disclosure. Referring to FIG. 10, the display apparatus in some embodiments further includes a unidirectional light transmitting layer 80 in the accessory hole AH that allows light transmit through the cover glass 40 and the optical clear adhesive layer 60 but substantially block light from transmitting along a direction from the optical clear adhesive layer 60 to the cover glass 40; and a light shielding coating 90 coated on at least a portion of a lateral wall LS defining the accessory hole AH. Moreover, the front side functional layer 30 is a continuous layer extending through the display region DR and the window region WR, and is present in the accessory hole AH. Optionally, the front side functional layer 30 includes a touch electrode layer. Optionally, the unidirectional light transmitting layer 80 is in direct contact with the cover glass 40. The optical clear adhesive layer 60 is in direct contact with the unidirectional light transmitting layer 80, and the accessory 70 is in direct contact with the optical clear adhesive layer 60. Optionally, the light shielding coating 90 is coated on substantially an entirety of the lateral wall LS defining the accessory hole AH.

Figure 11:
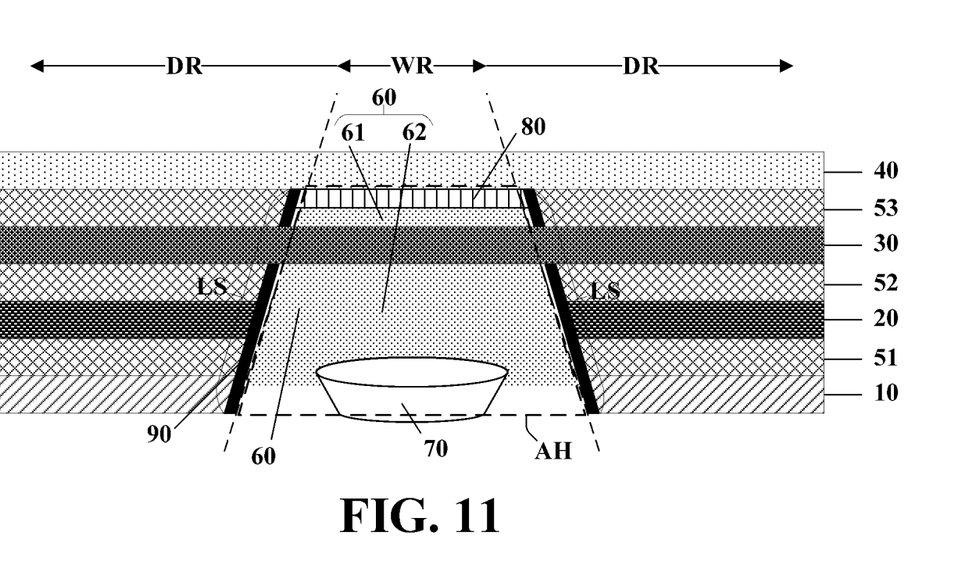
FIG. 11 is a cross-sectional view of a window region of a display apparatus in some embodiments according to the present disclosure.

FIG. 11 is a cross-sectional view of a window region of a display apparatus in some embodiments according to the present disclosure. Referring to FIG. 11, optionally, the optical clear adhesive layer 60 includes a first sub-layer 61 in the window region WR and between the cover glass 40 and a portion of the front side functional layer 30 in the accessory hole AH, and a second sub-layer 62 in the window region WR and on a side of the portion of the front side functional layer 30 in the accessory hole AH away from the cover glass 40. Optionally, the first sub-layer 61 and the second sub-layer 62 include a same material. Optionally, one side of the first sub-layer 61 is in direct contact with the unidirectional light transmitting layer 80 and an opposite side of the first sub-layer 61 is in direct contact with the portion of the front side functional layer 30 in the accessory hole AH. Optionally, the second sub-layer 62 is in direct contact with the portion of the front side functional layer 30 in the accessory hole AH.

Various appropriate optical clear adhesive materials may be used for making the optical clear adhesive layer 60, the first sub-layer 61, and the second sub-layer 62. In some embodiments, each of the optical clear adhesive layer 60, the first sub-layer 61, and the second sub-layer 62 includes an optical clear adhesive material having a refractive index greater than a refractive index of the cover glass 40, thereby reducing light reflection on a surface of the display apparatus. In some embodiments, each of the optical clear adhesive layer 60, the first sub-layer 61, and the second sub-layer 62 includes a light diffuser dispersed in the optical clear adhesive material. Examples of the light diffuser materials include titanium dioxide, talcum, calcium carbonate, barium sulfate, aluminum hydroxide, silica, glass, mica, white carbon, magnesium oxide, zinc oxide, acrylic-based particles, siloxane-based particles, melamine-based particles, polycarbonate-based particles, and styrene-based particles.

Optionally, the accessory 70 is a lens of a camera.

Examples of appropriate display apparatuses include, but are not limited to, an electronic paper, a mobile phone, a tablet computer, a television, a monitor, a notebook computer, a digital album, a GPS, etc. Optionally, the display apparatus further includes one or more integrated circuits connected to the display substrate 20. In one example, the display apparatus is a portable electronic apparatus such as a mobile phone.

In another aspect, the present disclosure provides a method of fabricating a display apparatus having a display region, and a window region substantially surrounded by the display region and configured to install an accessory therein. In some embodiments, the method includes forming a display region and forming a window region. Optionally, in the display region, the method includes forming a plurality of display functional layers, the plurality of display functional layers comprising a display substrate. Optionally, in the window region, the method includes forming an accessory hole in the window region; forming an optical clear adhesive layer at least partially occupying the accessory hole; and forming an accessory on a side of the optical clear adhesive layer away from the cover glass. Optionally, the display substrate is completely absent in an accessory hole in the window region. Optionally, the display apparatus is absent of an air layer between the optical clear adhesive layer and the cover glass.

In some embodiments, the method includes forming a back side functional layer; forming a display substrate on the back side functional layer; forming a front side functional layer on a side of the display substrate away from the back side functional layer; forming a cover glass on a side of the front side functional layer away from the display substrate; and forming a window region in the display apparatus, wherein the window region is substantially surrounded by the display region and configured to install an accessory therein, and wherein the display substrate and the back side functional layer are substantially removed in the window region. Optionally, forming the window region includes forming an accessory hole in the window region; forming an optical clear adhesive layer at least partially occupying the accessory hole; and forming the accessory on a side of the optical clear adhesive layer away from the cover glass. Optionally, the display apparatus is absent of an air layer between the optical clear adhesive layer and the cover glass.

Optionally, the optical clear adhesive layer is formed to be in direct contact with the cover glass; and the accessory is formed to be in direct contact with the optical clear adhesive layer. Optionally, the display apparatus is absent of any air layer between the cover glass and the accessory.

In some embodiments, the method further includes forming a unidirectional light transmitting layer in the accessory hole that allows light transmit through the cover glass and the optical clear adhesive layer but substantially block light from transmitting along a direction from the optical clear adhesive layer to the cover glass. Optionally, the unidirectional light transmitting layer is formed to be in direct contact with the cover glass; the optical clear adhesive layer is formed to be in direct contact with the unidirectional light transmitting layer; and the accessory is formed to be in direct contact with the optical clear adhesive layer.

Optionally, the optical clear adhesive layer is formed to completely occupy a portion of the accessory hole corresponding to the display substrate; and a portion of a lateral wall defining the accessory hole corresponding to the display substrate is completely covered by the optical clear adhesive layer.

In some embodiments, the method further includes forming a light shielding coating coated on at least a portion of a lateral wall defining the accessory hole.

Optionally, the optical clear adhesive layer is made of an optical clear adhesive material having a refractive index greater than a refractive index of the cover glass, thereby reducing light reflection on a surface of the display apparatus.

Optionally, the optical clear adhesive layer further comprises a light diffuser. Optionally, the light diffuser is selected from a group consisting of titanium dioxide, talcum, calcium carbonate, barium sulfate, aluminum hydroxide, silica, glass, mica, white carbon, magnesium oxide, zinc oxide, acrylic-based particles, siloxane-based particles, melamine-based particles, polycarbonate-based particles, and styrene-based particles.

In some embodiments, the front side functional layer is formed as a continuous layer extending through the display region and the window region, and is present in the accessory hole. Optionally, forming the optical clear adhesive layer includes forming a first sub-layer in the window region and between the cover glass and a portion of the front side functional layer in the accessory hole, and forming a second sub-layer in the window region and on a side of the portion of the front side functional layer in the accessory hole away from the cover glass. Optionally, the first sub-layer and the second sub-layer are made of a same material. Optionally, one side of the first sub-layer is formed to be in direct contact with the cover glass and an opposite side of the first sub-layer is formed to be in direct contact with the portion of the front side functional layer in the accessory hole.

Optionally, the second sub-layer is formed to be in direct contact with the portion of the front side functional layer in the accessory hole.

Optionally, the accessory hole is formed to be partially occupied and partially unoccupied by the optical clear adhesive layer. Optionally, the accessory is formed at least partially in the accessory hole.

Optionally, the accessory hole is completely occupied by the optical clear adhesive layer. Optionally, the optical clear adhesive layer partially extends outside the accessory hole, and the accessory is outside the accessory hole.

Figure 12A:
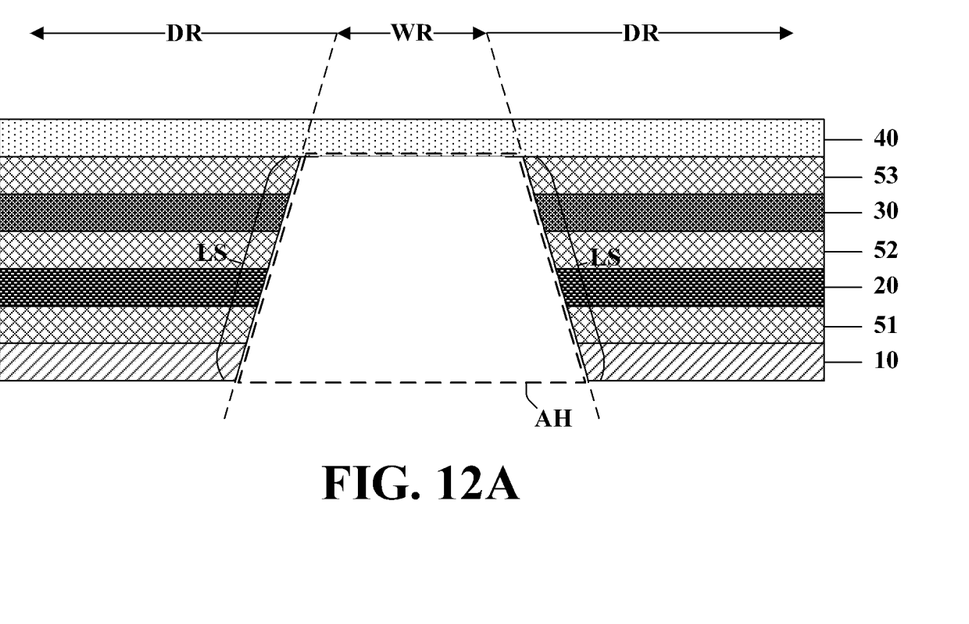
FIGS. 12A to 12E illustrate a method of fabricating a display apparatus in some embodiments according to the present disclosure.

FIGS. 12A to 12E illustrate a method of fabricating a display apparatus in some embodiments according to the present disclosure. Referring to FIG. 12A, a back side functional layer 10 is formed; a display substrate 20 is formed on the back side functional layer 10; a front side functional layer 30 is formed on a side of the display substrate 20 away from the back side functional layer 10; and a cover glass 40 is formed on a side of the front side functional layer 30 away from the display substrate 20. An aperture is punched into the display apparatus to form an accessory hole AH in a window region WR. The accessory hole AH is punched all the way through the display apparatus until it reaches the cover glass 40.

Figure 12B:
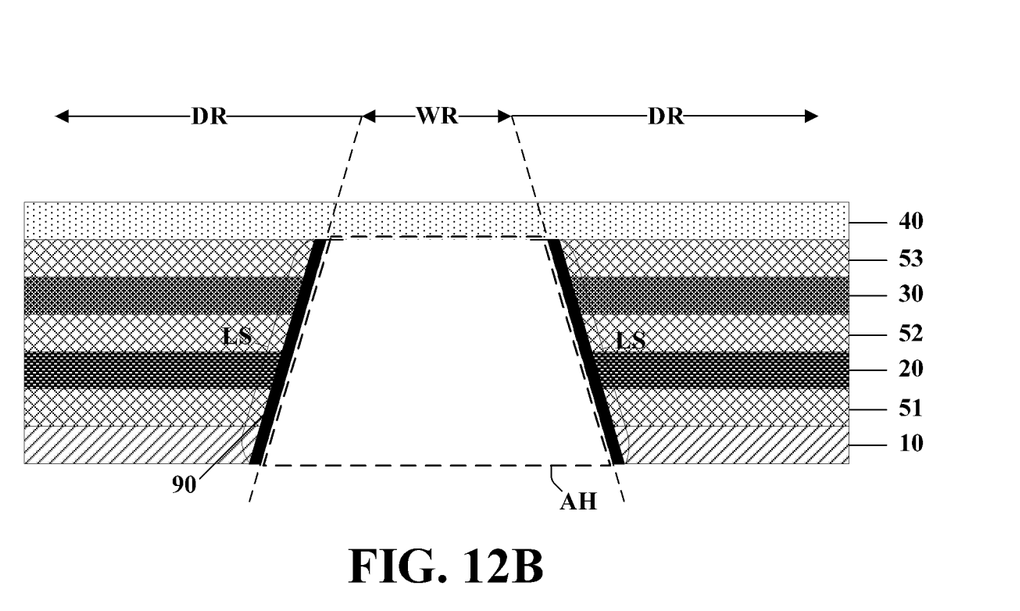

Referring to FIG. 12B, a light shielding coating 90 is coated on at least a portion of a lateral wall LS defining the accessory hole AH.

Figure 12C:
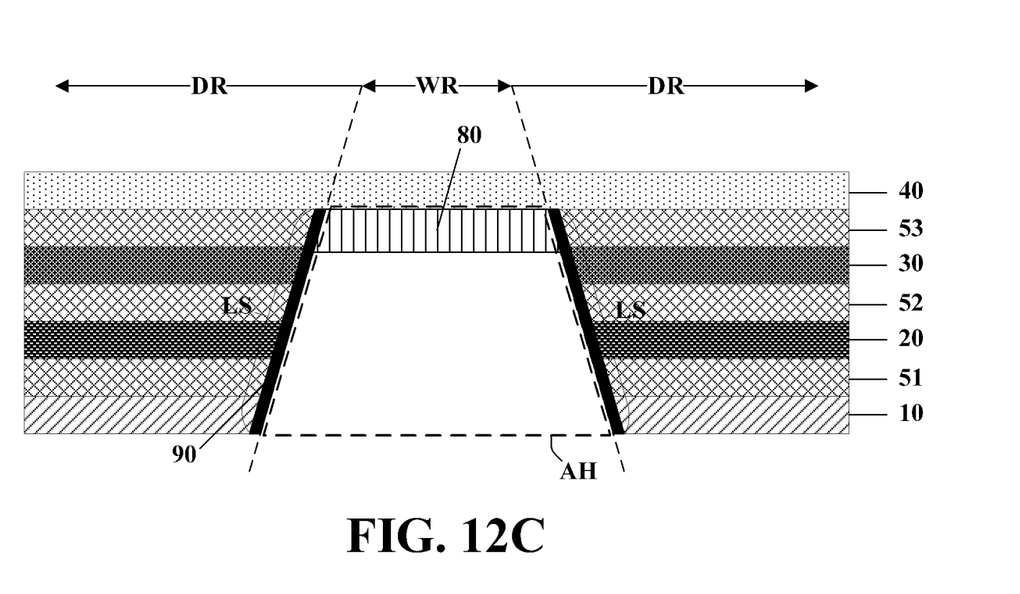

Referring to FIG. 12C, a unidirectional light transmitting layer 80 is formed in the accessory hole AR Optionally, the unidirectional light transmitting layer 80 is formed to be in direct contact with the cover glass 40.

Figure 12D:
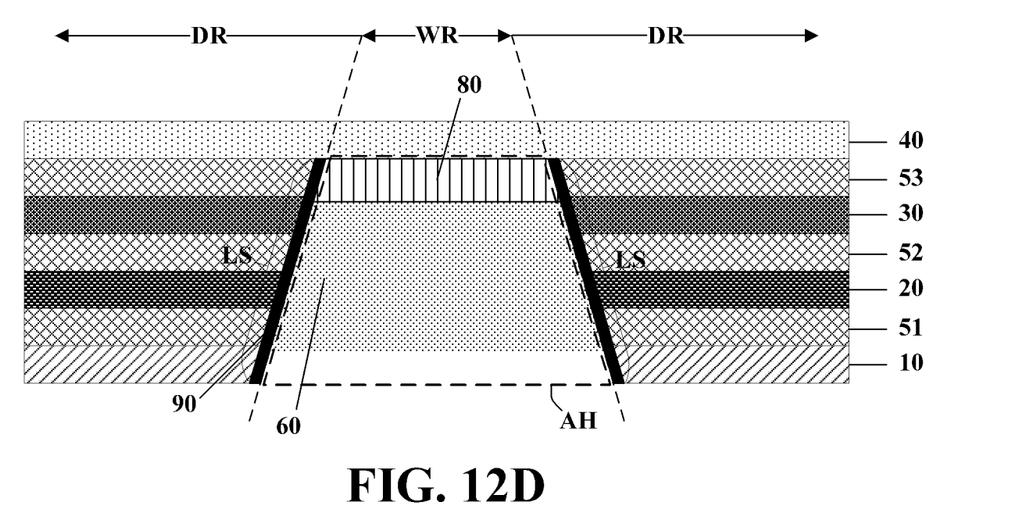

Referring to FIG. 12D, an optical clear adhesive layer 60 is formed at least partially occupying the accessory hole AH. Optionally, the optical clear adhesive layer 60 is formed to be in direct contact with the unidirectional light transmitting layer 80.

Figure 12E:
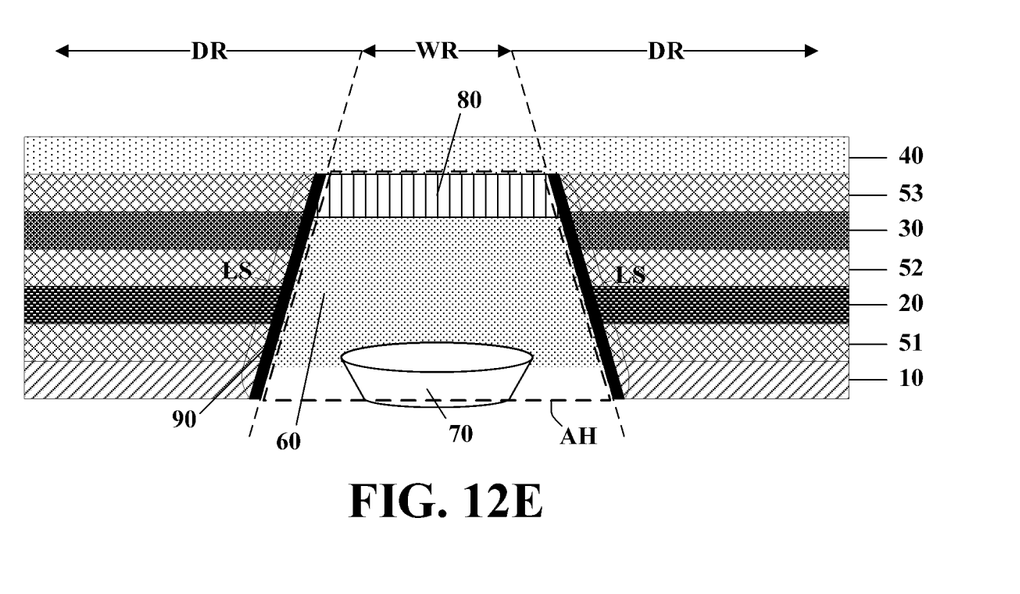

Referring to FIG. 12E, an accessory 70 is formed on a side of the optical clear adhesive layer 60 away from the cover glass 40. Optionally, the accessory 70 is formed to be in direct contact with the optical clear adhesive layer 60.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus having a display region, and a window region substantially surrounded by the display region and configured to install an accessory therein;
   wherein the display apparatus in the display region comprises a plurality of display functional layers, the plurality of display functional layers comprising a display substrate;
   wherein the display apparatus in the window region comprises:
   an optical clear adhesive layer at least partially occupying an accessory hole in the window region; and
   the accessory on a side of the optical clear adhesive layer away from a cover glass;
   wherein the display substrate is completely absent in the accessory hole; and
   the display apparatus is absent of any air layer between the optical clear adhesive layer and the cover glass;
   wherein the plurality of display functional layers in the display region comprises:
   a back side functional layer;
   the display substrate on the back side functional layer;
   a front side functional layer on a side of the display substrate away from the back side functional layer; and
   the cover glass on a side of the front side functional layer away from the display substrate;
   wherein the display substrate and the back side functional layer are completely absent in an accessory hole in the window region;
   the optical clear adhesive layer is in direct contact with the cover glass;
   the accessory is in direct contact with the optical clear adhesive layer; and
   the display apparatus is absent of any air layer between the cover glass and the accessory.

2. The display apparatus of claim 1, the optical clear adhesive layer completely occupies a portion of the accessory hole corresponding to the display substrate; and
   a portion of a lateral wall defining the accessory hole corresponding to the display substrate is completely covered by the optical clear adhesive layer.

3. The display apparatus of claim 1, wherein the display apparatus further comprises a light shielding coating coated on at least a portion of a lateral wall defining the accessory hole.

4. The display apparatus of claim 1, wherein the optical clear adhesive layer comprises an optical clear adhesive material having a refractive index greater than a refractive index of the cover glass, thereby reducing light reflection on a surface of the display apparatus.

5. The display apparatus of claim 4, wherein the optical clear adhesive layer further comprises a light diffuser.

6. The display apparatus of claim 5, wherein the light diffuser is selected from a group consisting of titanium dioxide, talcum, calcium carbonate, barium sulfate, aluminum hydroxide, silica, glass, mica, white carbon, magnesium oxide, zinc oxide, acrylic-based particles, siloxane-based particles, melamine-based particles, polycarbonate-based particles, and styrene-based particles.

7. The display apparatus of claim 1, wherein the front side functional layer is a continuous layer extending through the display region and the window region, and is present in the accessory hole; and
the optical clear adhesive layer comprises a first sub-layer in the window region and between the cover glass and a portion of the front side functional layer in the accessory hole, and a second sub-layer in the window region and on a side of the portion of the front side functional layer in the accessory hole away from the cover glass.

8. The display apparatus of claim 7, wherein the first sub-layer and the second sub-layer comprise a same material;
one side of the first sub-layer is in direct contact with the cover glass and an opposite side of the first sub-layer is in direct contact with the portion of the front side functional layer in the accessory hole; and
the second sub-layer is in direct contact with the portion of the front side functional layer in the accessory hole.

9. The display apparatus of claim 7, wherein the front side functional layer comprises a touch electrode layer.

10. The display apparatus of claim 1, wherein the accessory hole is partially occupied and partially unoccupied by the optical clear adhesive layer.

11. The display apparatus of claim 10, wherein the accessory is at least partially in the accessory hole.

12. The display apparatus of claim 1, wherein the accessory hole is completely occupied by the optical clear adhesive layer.

13. The display apparatus of claim 12, wherein the optical clear adhesive layer partially extends outside the accessory hole; and
the accessory is outside the accessory hole.

14. The display apparatus of claim 1, wherein the accessory is a lens of a camera.

15. A display apparatus having a display region, and a window region substantially surrounded by the display region and configured to install an accessory therein;
wherein the display apparatus in the display region comprises a plurality of display functional layers, the plurality of display functional layers comprising a display substrate;
wherein the display apparatus in the window region comprises:
an optical clear adhesive layer at least partially occupying an accessory hole in the window region; and
the accessory on a side of the optical clear adhesive layer away from a cover glass;
wherein the display substrate is completely absent in the accessory hole; and
the display apparatus is absent of any air layer between the optical clear adhesive layer and the cover glass;
wherein the plurality of display functional layers in the display region comprises:
a back side functional layer;
the display substrate on the back side functional layer;
a front side functional layer on a side of the display substrate away from the back side functional layer; and
the cover glass on a side of the front side functional layer away from the display substrate;
wherein the display substrate and the back side functional layer are completely absent in an accessory hole in the window region;
wherein the display substrate further comprises a unidirectional light transmitting layer in the accessory hole that allows light transmit through the cover glass and the optical clear adhesive layer but substantially block light from transmitting along a direction from the optical clear adhesive layer to the cover glass.

16. The display apparatus of claim 15, wherein the unidirectional light transmitting layer is in direct contact with the cover glass;
the optical clear adhesive layer is in direct contact with the unidirectional light transmitting layer; and
the accessory is in direct contact with the optical clear adhesive layer.

17. The display apparatus of claim 15, further comprising a light shielding coating coated on at least a portion of a lateral wall defining the accessory hole;
wherein the unidirectional light transmitting layer is in direct contact with the cover glass;
the optical clear adhesive layer is in direct contact with the unidirectional light transmitting layer;
the accessory is in direct contact with the optical clear adhesive layer;
the display apparatus is absent of any air layer between the cover glass and the accessory;
wherein the front side functional layer is a continuous layer extending through the display region and the window region, and is present in the accessory hole;
the optical clear adhesive layer comprises a first sub-layer in the window region and between the cover glass and a portion of the front side functional layer in the accessory hole, and a second sub-layer in the window region and on a side of the portion of the front side functional layer in the accessory hole away from the cover glass;
the first sub-layer and the second sub-layer comprise a same material;
one side of the first sub-layer is in direct contact with the cover glass and an opposite side of the first sub-layer is in direct contact with the portion of the front side functional layer in the accessory hole; and
the second sub-layer is in direct contact with the portion of the front side functional layer in the accessory hole.

18. A method of fabricating a display apparatus having a display region, and a window region substantially surrounded by the display region and configured to install an accessory therein, comprising:
in the display region, forming a plurality of display functional layers, the plurality of display functional layers comprising a display substrate;
in the window region, forming an accessory hole in the window region; forming an optical clear adhesive layer at least partially occupying the accessory hole; and forming an accessory on a side of the optical clear adhesive layer away from a cover glass;
wherein the display substrate is completely absent in the accessory hole; and
the display apparatus is absent of an air layer between the optical clear adhesive layer and the cover glass;
wherein forming the plurality of display functional layers in the display region comprises:
forming a back side functional layer;
forming the display substrate on the back side functional layer;
forming a front side functional layer on a side of the display substrate away from the back side functional layer; and forming the cover glass on a side of the front side functional layer away from the display substrate;

wherein the display substrate and the back side functional layer are completely absent in an accessory hole in the window region;

the optical clear adhesive layer is in direct contact with the cover glass;

the accessory is in direct contact with the optical clear adhesive layer; and the display apparatus is absent of any air layer between the cover glass and the accessory.

* * * * *